(12) United States Patent
Bertrand et al.

(10) Patent No.: US 10,651,364 B2
(45) Date of Patent: May 12, 2020

(54) SERVO VALVE WITH ASYMMETRICAL REDUNDANT PIEZOELECTRIC ACTUATOR

(71) Applicant: ZODIAC HYDRAULICS, Chateaudun (FR)

(72) Inventors: Jean-Luc Bertrand, Orleans (FR); Catherine Mailhan, Vendome (FR)

(73) Assignee: ZODIAC HYDRAULICS, Chateaudun (FR)

( * ) Notice: Subject to any disclaimer, the term of this patent is extended or adjusted under 35 U.S.C. 154(b) by 565 days.

(21) Appl. No.: 15/585,825

(22) Filed: May 3, 2017

(65) Prior Publication Data

US 2017/0324021 A1 Nov. 9, 2017

(30) Foreign Application Priority Data

May 3, 2016 (FR) ..................... 16 53985

(51) Int. Cl.
| | | |
|---|---|---|
| *H01L 41/09* | (2006.01) | |
| *F16K 31/00* | (2006.01) | |
| *F15B 11/05* | (2006.01) | |
| *F15B 13/043* | (2006.01) | |
| *B60W 30/18* | (2012.01) | |
| *F02D 29/04* | (2006.01) | |
| *F15B 15/02* | (2006.01) | |
| *F16H 61/421* | (2010.01) | |
| *F15B 13/04* | (2006.01) | |

(52) U.S. Cl.
CPC ......... *H01L 41/0906* (2013.01); *B60W 30/18* (2013.01); *F02D 29/04* (2013.01); *F15B 11/05* (2013.01); *F15B 13/0436* (2013.01); *F15B 15/02* (2013.01); *F16H 61/421* (2013.01); *F16K 31/004* (2013.01)

(58) Field of Classification Search
CPC .... H01L 41/0906; B60W 30/18; F02D 29/04; F15B 13/0436; F15B 15/02; F15B 11/05; F16H 61/421; F16K 31/004
USPC .................................................. 310/311–371
See application file for complete search history.

(56) References Cited

U.S. PATENT DOCUMENTS

2013/0241348 A1* 9/2013 Wuerfel ................ H01L 41/042
310/317

FOREIGN PATENT DOCUMENTS

| DE | 44 31 600 A1 | 3/1996 | |
|---|---|---|---|
| EP | 0012743 A1 | 6/1980 | |
| EP | 0 504 465 A1 | 9/1992 | |
| FR | 3051027 A1 * | 3/2016 | ............ F15B 13/042 |
| WO | WO 01/059306 A1 | 8/2001 | |

* cited by examiner

*Primary Examiner* — Thomas M Dougherty
(74) *Attorney, Agent, or Firm* — Muncy, Geissler, Olds & Lowe, P.C.

(57) ABSTRACT

A driving stage of a servo valve, including a hydraulic ejector and a hydraulic receiver able to be moved relative to each other, one of the two hydraulic units being integral with a mobile unit, movable relative to a body of the servo valve through actuation means, characterized in that the actuation means comprise two piezoelectric actuators connected in series. Control device comprising a servo valve comprising such a driving stage.

10 Claims, 4 Drawing Sheets

SERVO VALVE WITH ASYMMETRICAL REDUNDANT PIEZOELECTRIC ACTUATOR

PREAMBLE

The work having culminated in this invention received funds from the "Seventh Framework (FP7/2007-2013)" programme of the European Union for the CLEAN SKY JOINT TECHNOLOGY Initiative under approval number 325953.

DOMAIN OF THE INVENTION

The invention relates to a servo valve driving stage, able to act as a first stage in a two-stage servo valve.

TECHNOLOGICAL BACKGROUND OF THE INVENTION

A conventional servo valve consists of a driving stage controlling a mobile power distribution component of a power stage. The function of the power stage is to deliver pressure or an output flow proportional to an instruction transmitted to the driving stage.

The driving stage includes two hydraulic units, namely a hydraulic emitter (nozzle or ejector) and a hydraulic receiver (vane, deflector or fixed receiver), whose change of relative position generates pressure differentials, which are used to move a mobile power distribution component of the servo valve power stage finely. This mobile power distribution component slides in a cylindrical jacket embedded in the body of the servo valve. The relative positions of the hydraulic units are usually driven by a torque motor comprising a set of coils acting on a mobile magnetic vane integral with one of the hydraulic units of the driving stage. A nominal current applied by a control unit to the coils of the torque motor causes a movement of the vane and hence a change of the relative position of the hydraulic unit connected to it relative to the fixed hydraulic unit, integral with the body. The movement in its jacket of the mobile power distribution component then connects a set of bored channels and ports whose arrangement makes it possible to deliver pressure or an output flow proportional to the displacement of said mobile power distribution component.

Such a servo valve is generally connected to a hydraulic actuator, for example an aircraft wing flap actuator, so as to form a device for controlling this actuator.

For the particularly critical functions of an aircraft, such as the flight controls or braking systems, a second set of coils is frequently provided in the torque motor in parallel with the first, so that the second set of coils takes over in the event of a failure (short circuit or open circuit) of the first set of coils. This complies with the principle of functioning safety through parallel redundancy of systems.

Such a servo valve requires a magnetic circuit and charged permanent magnets, which increases the complexity of the assembly and the dispersion of performance. In fact, the performance of such a servo valve is sensitive to variations of the magnetic properties of the materials used in the magnetic circuit. Finally, when constructing such a servo valve, it is necessary to provide a step for adjusting the magnetization of the permanent magnets.

AIM OF THE INVENTION

The aim of the invention is to simplify the manufacturing operations of a servo valve and to reduce its dispersion of performance.

SUMMARY OF THE INVENTION

For the purpose of achieving this aim, a driving stage for a servo valve is proposed, the driving stage including a hydraulic unit for ejecting a jet of fluid and a hydraulic unit for receiving the jet of fluid, the hydraulic units being able to be moved relative to each other so as to change their relative position and thereby to generate a pressure differential, one of the two hydraulic units being fixedly mounted on a body of the servo valve and the other hydraulic unit being integral with a mobile unit of the driving stage, movable relative to a body of the servo valve through actuating means. The actuating means comprise a first and a second piezoelectric actuator connected in series.

According to the invention, the maximum elongation of the first piezoelectric actuator is substantially equal to half the maximum elongation of the second piezoelectric actuator. This particular arrangement allows the first stage to ensure a return to a safety position in all failure configurations.

The invention also comprises a device for controlling a hydraulic actuator comprising such a servo valve and a control unit, in which the control unit selectively adopts one control configuration among a plurality of control configurations, the plurality of control configurations comprising a first control configuration called normal and a second control configuration called degraded, in the normal configuration, the control unit powers at least the first actuator;
in the degraded configuration, the control unit powers at least the second actuator.

Other characteristics and advantages of the invention will emerge in the light of the description that follows of particular non-limitative embodiments of the invention.

BRIEF DESCRIPTION OF THE FIGURES

Reference will be made to the attached figures, among which.

DETAILED DESCRIPTION OF THE INVENTION

Figure 1:
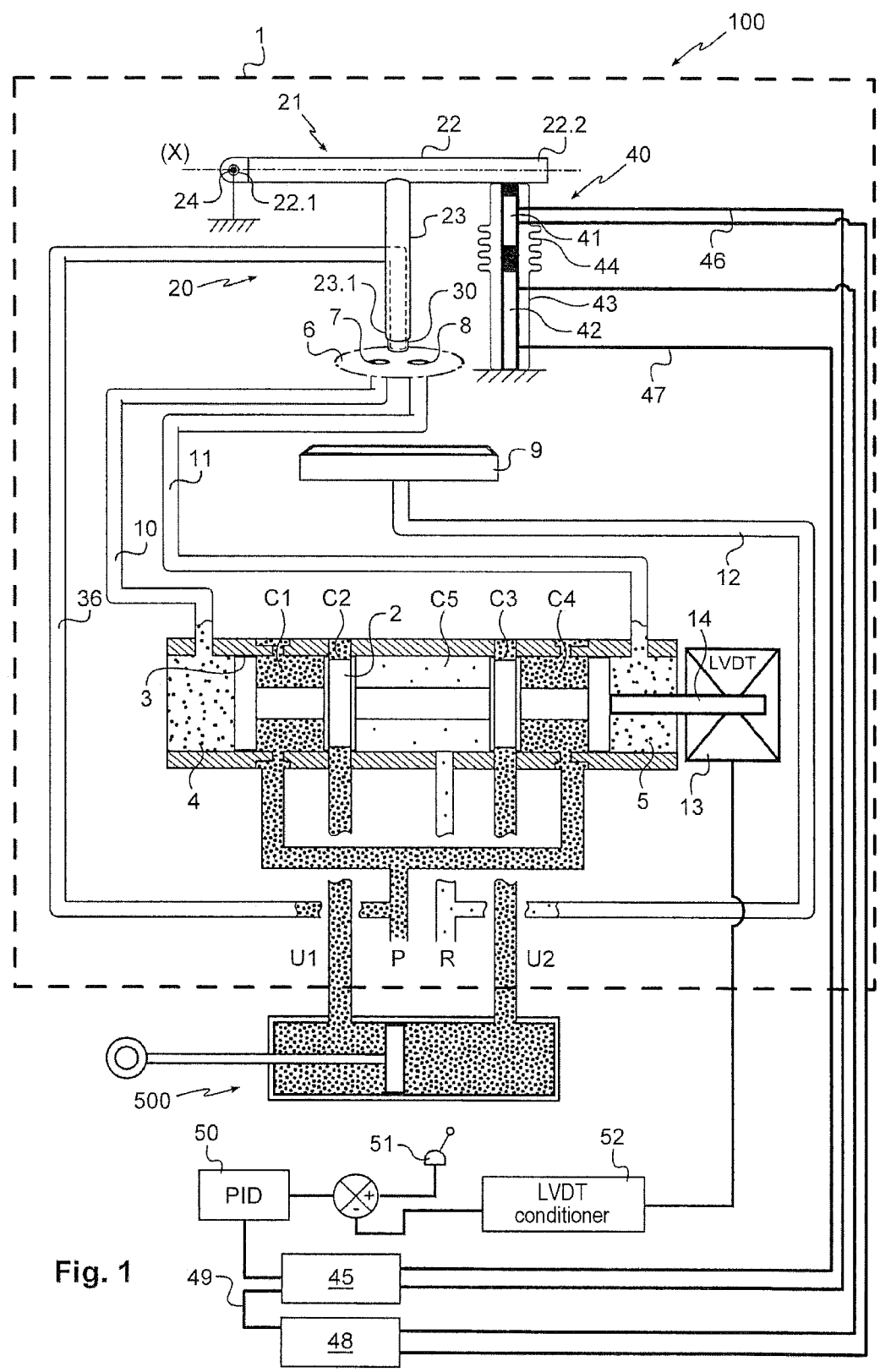
FIG. 1 is a diagrammatic representation of a servo valve comprising a first stage according to the invention.

With reference to FIG. 1, the invention is illustrated here as applied to a servo valve for regulating barometric output with two stages including a driving stage. Of course, the invention is not limited to this application, and can be used for other types of servo valve. The servo valve, generally designated 100, includes a body 1, in which a power distribution component 2 is installed to slide, hermetically sealed, in a cylindrical housing 3 while forming the distribution stage. The power distribution component 2 is mobile between two extreme positions and is configured to delimit sealed chambers C1, C2, C3, C4 and C5 in the housing 3 and thereby to connect respectively, according to the position of the power distribution component 2 relative to a centred position (or neutral position):

either a power port P with a first utilization port U1, and a return port R with a second utilization port U2, or the power port P with the second utilization port U2, and the return port R with the first utilization port U1.

Control of the sliding of the power distribution component 2 in the housing 3 is ensured by means of driving chambers 4, 5, which are supplied with pressurized fluid by a pressure distribution component, in this case a fixed receiver 6. The receiver 6 comprises two orifices 7 and 8 respectively, in fluid connection, via conduits 10 and 11, with the driving chambers 4 and 5. A receptacle 9, situated substantially plumb with the receiver 6, collects the hydraulic fluid when the latter is not directed towards either of the orifices 7 or 8. The receptacle 9 is connected to the return R by a conduit 12. A linear sensor 13 of the LVDT type measures the position of the mobile power distribution component 2 in its housing 3. The core 14 of the sensor 13 is connected to the mobile power distribution component 2 by a rod passing through one of the ends of the cylindrical housing 3.

The driving stage 20 of the servo valve 1 comprises a mobile unit 21, which includes a first portion 22 with a rectangular section and a second tubular portion 23, protruding orthogonally from the middle of the portion 22.

The first and second portions 22 and 23 form a mobile assembly 21 having a substantially T shaped section. A first end 22.1 of the first portion 21 is hinged by a pin 24 on the body 1 of the servo valve 100. The other end 22.2 opposite the end 21.1 rests on actuating means 40 extending along a direction substantially perpendicular to a longitudinal axis (X) of the first portion 22. The second tubular portion 23 is in fluid connection with the supply port P through a conduit 36 and comprises at its end 23.1 a fluid ejector 30 for ejecting a jet of fluid towards the orifices 7 and 8 according to the relative position of the ejector 30 and the orifices 7 and 8.

Figure 2:
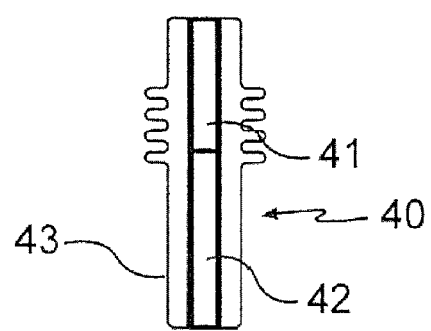
FIG. 2 is a diagrammatic view of actuating means according to the invention.
Figure 3:
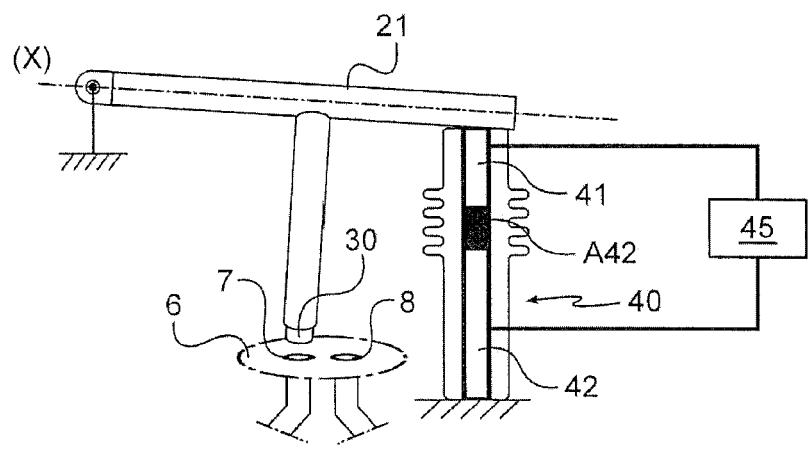
FIG. 3 is a partial diagrammatic view of the first stage of the servo valve of FIG. 1 in a first particular position of a first control configuration.

The actuating means 40 comprise a first piezoelectric actuator 41 and a second piezoelectric actuator 42 installed in series, as shown in FIG. 2. A metal cowling 43 extends around the first and second actuators 41 and 42 and comprises an elastic bellows 44, which allows the first and the second actuators 41 and 42 to be subjected to the same pre-charge. In the meaning of the present application, two actuators are installed in series when they are arranged so that their respective elongations add together.

The first actuator 41 and the second actuator 42 are respectively connected to a control unit 45 by a first cable 46 and a second cable 47. The control unit 45 is disposed to power the first and second actuators 41 and 42. A monitoring module 48, known to a specialist, monitors the functioning of the first and second actuators 41 and 42 and informs the control unit 45 of the functioning state of the first and second actuators 41 and 42 through a cable 49. The assembly consisting of the servo valve 100 and the control unit 45 then constitutes a device controlling a hydraulic actuator 500 for controlling an aircraft wing flap connected to the utilization ports U1 and U2. The control unit 45 is connected in turn to a PID controller 50 receiving an error signal arising from the difference between the set value exerted on a driving control 51 and a measurement of the position of the power distribution component 2 transmitted by the sensor 13, whose signal is processed beforehand by a conditioner 52.

According to the set value applied to the control 51 and the information supplied to the controller 50, an instruction is sent to the control unit 45. This unit applies a pair of voltages to the terminals of the first and second actuators 41 and 42. The elongations A41 and A42, respectively of the actuators 41 and 42, are proportional to the voltages applied to them. The total elongation A40 of the actuating means 40, which is equal to the sum of the elongations A41 and A42 of the actuators 41 and 42, causes a movement of the ejector 30 opposite the orifices 7 and 8 of the receiver 6. The pressure differential created causes the mobile power distribution component 2 to move, and hence a change of the pressure values as outlet from the utilization ports U1 and U2. The pressure pair U1 and U2 causes the hydraulic actuator 500 to move.

In this case, the first and second actuators 41 and 42 respectively have a maximum elongation Amax41 and Amax42. Here, the maximum elongation Amax41=$\delta$ of the first actuator 41 is substantially equal to half the maximum elongation Amax42=$2\delta$ of the second actuator 42.

As a reminder, two types of failure can affect a piezoelectric actuator. It is either short-circuited, which is generally due to an internal fault. Or it is in open circuit, which can happen in the event of a failure of the connection system to which it is connected. When a piezoelectric actuator is short-circuited, it discharges and returns to its initial length, which corresponds to a zero voltage applied to its terminals. When a piezoelectric actuator is in open circuit, it retains its length and returns very slowly to its initial length in a time generally longer than one hour.

FIGS. 3 to 8 show some particular control configurations which the control unit 45 can adopt and the state of the first and second actuators 41 and 42 subjected to these particular control configurations. On these figures, the elongations of the first and second actuators are shown as blackened portions.

In a first control configuration, called normal, the control unit 45 applies the following voltages to the actuators:

first actuator 41 powered with a variable voltage which depends on the set value applied to the control 51, corrected if necessary by the controller 50;

second actuator 42 powered with a constant voltage corresponding to an elongation A42 of the second actuator 42 equal to Amax42/2.

In the normal control configuration, the elongation A40 of the actuating means 40 is therefore equal to A40=(Amax42/2)+A41=$\delta$+A41 and the end of the actuating means 40 can be positioned in an elongation range of the actuating means 40 within the range [$\delta$; $2\delta$]. In this configuration, the ejector 30 faces the orifice 7 (FIG. 3) of the receiver 6 when the elongation A41 of the first actuator 41 is zero (A40=$\delta$). The pressure differential thus created between the driving chambers 4 and 5 causes the power distribution component 2 to move to the right in its housing 3 as shown in FIG. 1 (increased volume of the driving chamber 4).

Figure 4:
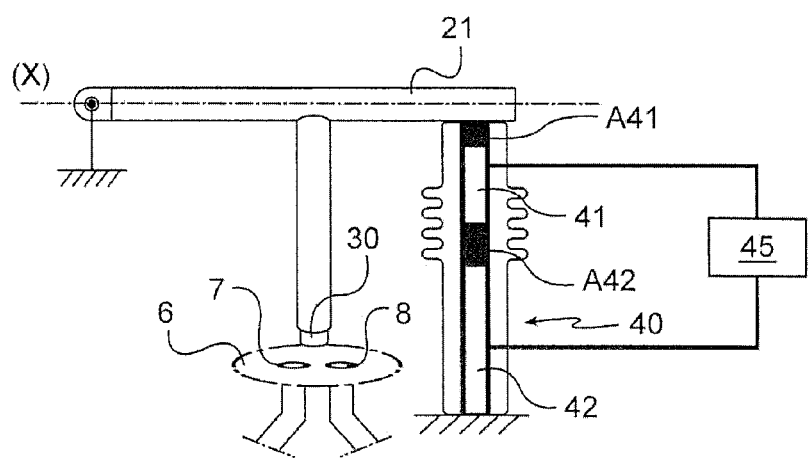
FIG. 4 is a partial diagrammatic view of the first stage of the servo valve of FIG. 1 in a second particular position of a first control configuration.
Figure 5:
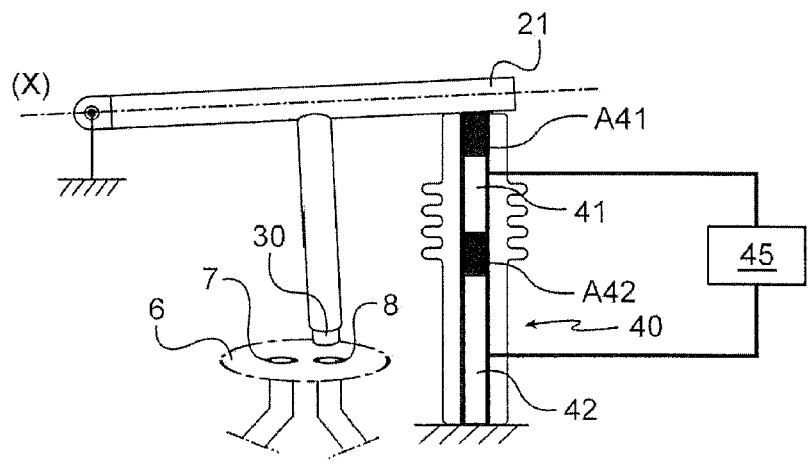
FIG. 5 is a partial diagrammatic view of the first stage of the servo valve of FIG. 1 in a second particular position of a first control configuration.
Figure 6A:
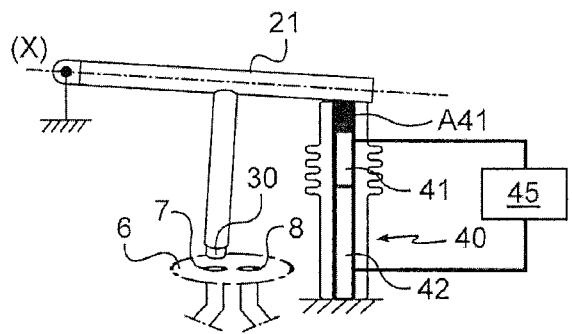
FIGS. 6a, 6b, 7a, and 7b are partial diagrammatic views of the first stage of the servo valve of FIG. 1 in particular positions of a second control configuration.
Figure 6B:
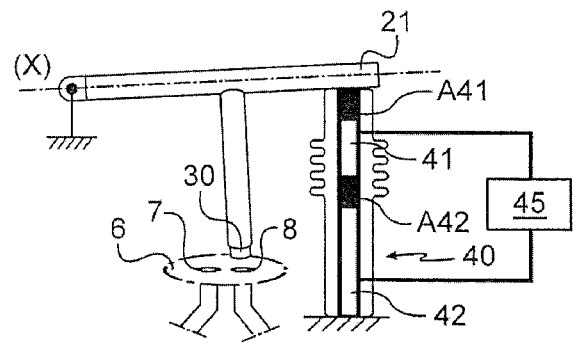
Figure 7A:
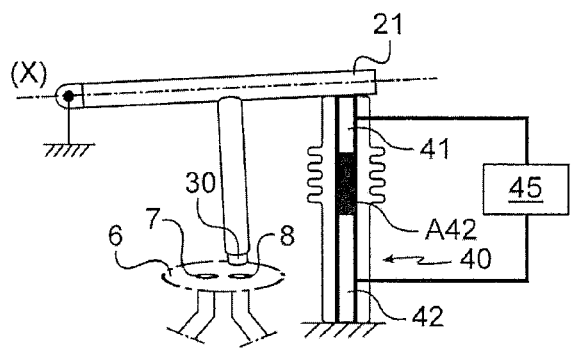
Figure 7B:
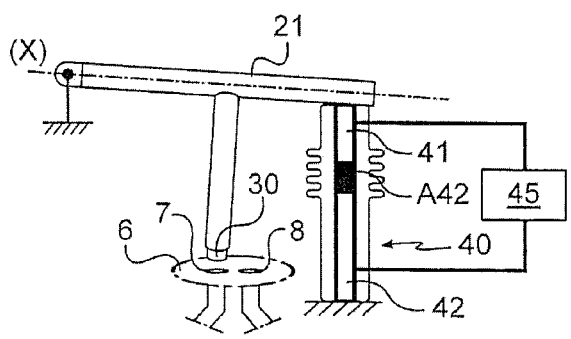

When the voltage applied to the terminals of the first actuator 41 by the control unit 45 is equal to half the maximum applicable voltage, the elongation of the first actuator 41 is equal to half its maximum elongation and the elongation A40 of the actuating means 40 is A40=(Amax42/2)±(Amax41/2)=$1.5\delta$. The ejector 30 is then situated between the two orifices 7 and 8 of the receiver 6 and no pressure differential is created between the driving chambers 4 and 5 (FIG. 4). The power distribution component 2 therefore remains immobile.

When the voltage applied to the terminals of the first actuator 41 by the control unit 45 is equal to the maximum applicable voltage, the elongation A41 of the first actuator 41 is equal to its maximum elongation Amax41=δ and the elongation A40 of the actuating means 40 is A40=(Amax42/2)+Amax41=2δ. The ejector 30 faces the orifice 8 (FIG. 5) of the receiver 6. The pressure differential thus created between the driving chambers 4 and 5 causes the power distribution component 2 to move to the right in its housing 3 as shown in FIG. 1 (increased volume of the driving chamber 4). In this normal control configuration, the first actuator 41 can also adopt a plurality of elongation values A41 that correspond to as many possible set values applied to the control 51.

A second control configuration, called degraded, is implemented in the event of a failure of the first actuator 41 being detected by the monitoring module 48. In this configuration, the control unit 45 powers the second actuator 42 to make its elongation vary between 0 and $A_{max}42=2\delta$ according to the type of failure of the first actuator.

If the first actuator is in open circuit with its elongation value between 0 and $A_{max}41=\delta$ (FIGS. 6a-6b), or short-circuited with an elongation equal to 0 (FIGS. 7a-7b), the control unit 45 can apply a voltage to the terminals of the second actuator 42, enabling an elongation of the latter of between 0 and 2δ. In this degraded configuration, the actuating means 40 are always capable of covering an elongation range equal to [δ; 2δ] and therefore of responding to the set values applied to the control 51.

Figure 8A:
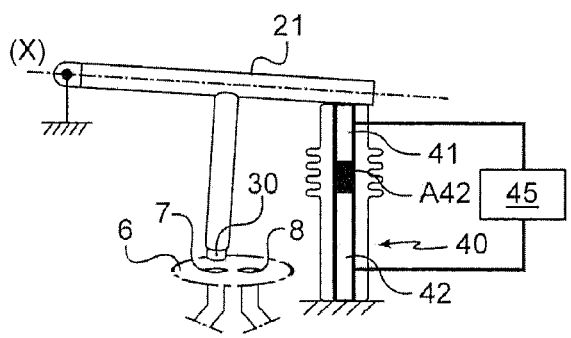
FIGS. 8a and 8b are partial diagrammatic views of the first stage of the servo valve of FIG. 1 in particular positions of a third control configuration.
Figure 8B:
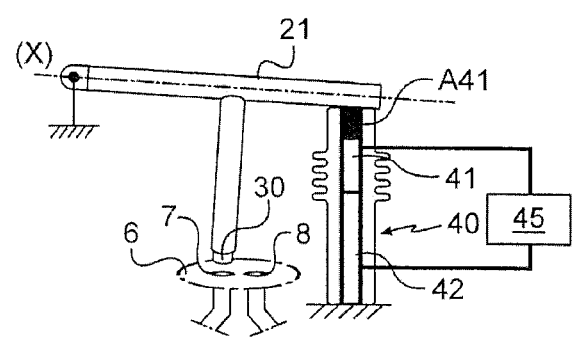

If a failure of the second actuator 42 is detected when the latter is in open circuit with its elongation value equal to δ, functioning is identical to that of the normal configuration, until the elongation of the second actuator 42 becomes smaller than δ (FIG. 8a). A third configuration, called safety, is then implemented when the second actuator 42 has an elongation smaller than S. In this configuration, it is no longer possible for the actuating means 40 to cover the elongation range of [δ; 2δ] and the first actuator 41 is then powered to reach a maximum elongation $A_{max}41=\delta$ so that the receiver 30 at least partially faces the orifice 7 of the receiver 6 (FIG. 8b). In this conservative configuration, the servo valve 100 adopts its safety position, namely a slider abutted on one side (here the slider 2 abuts the right side of the housing 3 as shown in FIG. 1) and hence a maximum output between U1 and U2. This case is obtained in normal functioning for a minimum set value of the servo valve 1. The safety position of the servo valve 1 is therefore quite different from the hydraulic zero of the servo valve 1, which corresponds to a nil output between U1 and U2.

We therefore obtain a device for controlling a hydraulic actuator 500 comprising a redundant first and second piezoelectric actuator 41 and 42 installed in series. The use of piezoelectric actuators intrinsically improves reliability, as these are robust actuators whose failure rates are lower than those of coils. For a same application where a fluid ejector is moved facing a receiver, the piezoelectric actuators of the invention have a smaller mass and size compared with the solutions of the prior art that implement coils.

Of course, the invention is not limited to what has just been written, but encompasses any variant residing within the framework defined by the claims.

In particular,
- although the core of the LVDT sensor here is connected to the mobile power distribution component by a rod passing through one of the ends of the cylindrical housing, the invention also applies to other means of detecting the position of the slider, such as for example other types of passive or active position sensors: resistive, capacitive or optical for example;
- although the mobile unit here is in the shape of a T, one end of which is hinged on the body of the servo valve, the invention also applies to other types of mobile units, such as for example a mobile unit in the shape of an L, a mobile unit extending along a single longitudinal direction, or a mobile unit of any shape. The mobile unit can be hinged on the body, installed loose or clamped on the body, provided that the portion that supports one of the hydraulic units is capable of being moved relative to the other hydraulic unit under the action of the actuator;
- although the mobile unit here comprises a tubular portion, which provides a fluid connection from the supply port to the fluid ejector, the invention also applies to other types of fluid supply, such as for example a flexible supply or a supply through an external conduit fitted to the rod;
- although the actuating means here comprise a first and second piezoelectric actuator, the invention also applies to other actuating means able to contain more than two piezoelectric actuators;
- although a metal cowling comprising an elastic bellows here extends around the first and second piezoelectric actuators, the invention also applies to other means of pre-charging the first and second piezoelectric actuators, such as for example an elastic unit installed in one of the ends of the first or second piezoelectric actuators, the cowling can also be in another material such as an elastomer;
- although the relation α between the maximum elongation of the first and second piezoelectric actuators here is substantially equal to 2 (the maximum elongation of the first actuator is substantially equal to half the maximum elongation of the second actuator), the invention also applies to other values of the relation α between the maximum elongations of the first and second actuators. For example, if priority is given to the compactness of the actuator rather than to its ability to retain full performance after a failure of the first piezoelectric actuator, the relation α can be comprised between one and two and thus guarantee a return to the safety position. If, on the contrary, priority is given to the reliability of the actuating means, the relation α can be chosen as more than two, which makes it possible to reduce the control voltage applied to the second piezoelectric actuator and thus to reduce its loading and fatigue;
- although the actuator here is connected to a PID controller, the invention also applies to other types of controller, such as for example purely proportional or purely derivative or proportional derivative;
- although the fixed hydraulic unit here is a fluid receiver and the unit installed in the end of the rod is a fluid emitter, the invention also applies to a fluid emitter fixed to a body of the servo valve and to a fluid receiver, such as for example a deflector or a vane, installed on the mobile unit;
- although the supply pressure here is delivered to the chambers C4 and C1 and chamber C5 is set on return, the invention also applies to a power stage in which these supplies would be reversed;

although the servo valve here is a two-stage servo valve comprising a power stage including a power distribution component, whose change of position is controlled by the pressure differential generated by the first stage, the invention also applies to a single-stage servo valve in which the pressure differential is used directly to control an actuator or a hydraulic charge;

although the control unit here exclusively powers the second actuator in the degraded control configuration, the invention also applies to a degraded control configuration in which the control unit continues to power the first piezoelectric actuator;

although the control unit here exclusively powers the first actuator in the safety control configuration, the invention also applies to a safety control configuration in which the control unit continues to power the second piezoelectric actuator;

although the control unit, in the safety control configuration, powers the first actuator so that it reaches its maximum elongation, the invention also applies to a safety control configuration in which the control unit powers the first piezoelectric actuator so that the fluid ejector permanently faces the orifice 7 whatever the elongation of the second actuator;

although holding the mobile unit in a position such that the servo valve is in its safety position is ensured here by powering the piezoelectric actuators, the invention also applies to holding the mobile unit in a safety position so that the servo valve is in a safety position by other means, such as for example an automatic return (through its own or other elasticity) of the mobile unit to a safety position or a stop holding the mobile unit in a safety position;

although the servo valve and the control unit 45 here control a hydraulic actuator for controlling an aircraft wing flap, the invention also applies to the control of other types of actuators, such as for example hydraulic actuators for braking, for directing the inclination of blades.

The invention claimed is:

1. A driving stage of a servo valve, the driving stage including a hydraulic unit for ejecting a jet of fluid and a hydraulic unit for receiving the jet of fluid, the hydraulic units being able to be moved relative to each other so as to change their relative position and thereby to generate a pressure differential, one of the two hydraulic units being fixedly mounted on a body of the servo valve and the other hydraulic unit being integral with a mobile unit of the driving stage, movable relative to a body of the servo valve through actuating means, the actuating means comprising a first piezoelectric actuator and a second piezoelectric actuator connected in series, the maximum elongation (Amax41) of the first piezoelectric actuator being substantially equal to half the maximum elongation (Amax42) of the second piezoelectric actuator.

2. The driving stage according to claim 1, in which the fixed hydraulic unit is a fluid receiver and the hydraulic unit integral with the mobile unit is a fluid ejector.

3. The driving stage according to claim 1, in which the actuating means comprise a cowling extending around the first and second piezoelectric actuators, the cowling comprising means for pre-charging the first and the second piezoelectric actuators.

4. The driving stage according to claim 3, in which the pre-charging means comprise an elastic bellows.

5. A device for controlling a hydraulic actuator comprising a servo valve including a driving stage according to claim 1 and a control unit, the control unit selectively adopting one control configuration among a plurality of control configurations, the plurality of control configurations comprising a first control configuration called normal and a second control configuration called degraded,
in the normal configuration, the control unit powers at least the first piezoelectric actuator;
in the degraded configuration, the control unit powers at least the second piezoelectric actuator.

6. The device according to claim 5, in which, in the normal configuration, the control unit powers the first and the second piezoelectric actuator.

7. The device according to claim 5, in which, in the degraded configuration, the control unit only powers the second piezoelectric actuator.

8. The device according to claim 5, in which the plurality of control configurations comprises a third control configuration called safety, in which only one of the piezoelectric actuators is powered.

9. The device according to claim 8, in which, in the safety configuration, only the first piezoelectric actuator is powered.

10. The device according to claim 5, in which:
in the normal configuration, the control unit powers the second piezoelectric actuator so that the latter extends to half its maximum elongation (Amax42) whatever the power supply voltage of the first piezoelectric actuator;
in the degraded configuration, the control unit powers the second piezoelectric actuator so that the latter extends beyond half its maximum elongation (Amax42).

* * * * *